(12) United States Patent
Park

(10) Patent No.: US 9,779,799 B2
(45) Date of Patent: Oct. 3, 2017

(54) SEMICONDUCTOR DEVICE HAVING INPUT/OUTPUT LINE DRIVE CIRCUIT AND SEMICONDUCTOR SYSTEM INCLUDING THE SAME

(71) Applicant: SK hynix Inc., Incheon-si, Gyeonggi-do (KR)

(72) Inventor: Min Su Park, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 8 days.

(21) Appl. No.: 14/925,353

(22) Filed: Oct. 28, 2015

(65) Prior Publication Data

US 2017/0032833 A1    Feb. 2, 2017

(30) Foreign Application Priority Data

Jul. 27, 2015    (KR) ........................ 10-2015-0106091

(51) Int. Cl.

| | |
|---|---|
| *G11C 7/10* | (2006.01) |
| *G11C 11/408* | (2006.01) |
| *G11C 11/406* | (2006.01) |
| *G11C 11/4091* | (2006.01) |
| *G11C 11/4094* | (2006.01) |
| *G11C 11/4093* | (2006.01) |

(52) U.S. Cl.
CPC ........ *G11C 11/4085* (2013.01); *G11C 11/406* (2013.01); *G11C 11/4087* (2013.01); *G11C 11/4091* (2013.01); *G11C 11/4093* (2013.01); *G11C 11/4094* (2013.01); *G11C 11/40603* (2013.01); *G11C 11/40618* (2013.01)

(58) Field of Classification Search
CPC ............. G11C 11/4085; G11C 11/406; G11C 11/4091; G11C 11/4093; G11C 11/4094; G11C 11/4087; G11C 11/40603; G11C 11/40618
USPC ..... 365/189.05, 189.07, 203, 205, 207, 208, 365/222, 236

See application file for complete search history.

(56) References Cited

U.S. PATENT DOCUMENTS

| | | | | |
|---|---|---|---|---|
| 6,327,210 B1 * | 12/2001 | Kuroda | ................. | G11C 11/406 365/222 |
| 6,426,909 B1 * | 7/2002 | Tomita | ................. | G11C 11/406 365/222 |
| 7,471,585 B2 * | 12/2008 | Shinozaki | ............. | G11C 11/406 365/222 |
| 7,898,899 B2 * | 3/2011 | Kobayashi | ........... | G11C 7/1006 365/189.05 |

(Continued)

FOREIGN PATENT DOCUMENTS

KR    1020040014838 A    2/2004

*Primary Examiner* — Toan Le
(74) *Attorney, Agent, or Firm* — William Park & Associates Ltd.

(57) ABSTRACT

A semiconductor system includes a first semiconductor device and a second semiconductor device. The first semiconductor device outputs a command/address signal. The second semiconductor device extracts an active signal, a pre-charge signal, and addresses from the command/address signal, performs an active operation on a memory cell corresponding to the addresses, and performs a refresh operation on the memory cell corresponding to counting signals generated by counting a number of pulses in a refresh signal.

10 Claims, 9 Drawing Sheets

(56) References Cited

U.S. PATENT DOCUMENTS

| | | | |
|---|---|---|---|
| 8,284,615 B2* | 10/2012 | Shim | G11C 7/04 |
| | | | 365/222 |
| 8,908,461 B2* | 12/2014 | Kim | G11C 11/402 |
| | | | 365/222 |
| 8,953,403 B1* | 2/2015 | Song | G11C 11/40618 |
| | | | 365/222 |
| 2002/0145930 A1 | 10/2002 | Bando | |
| 2006/0209612 A1* | 9/2006 | Kajigaya | G11C 11/406 |
| | | | 365/222 |
| 2009/0016143 A1* | 1/2009 | Incarnati | G11C 8/14 |
| | | | 365/230.01 |
| 2013/0128681 A1* | 5/2013 | Kim | G11C 11/406 |
| | | | 365/207 |

* cited by examiner

SEMICONDUCTOR DEVICE HAVING INPUT/OUTPUT LINE DRIVE CIRCUIT AND SEMICONDUCTOR SYSTEM INCLUDING THE SAME

CROSS-REFERENCE TO RELATED APPLICATIONS

The present application claims priority under 35 U.S.C. 119(a) to Korean Patent Application No. 10-2015-0106091 filed on Jul. 27, 2015, in the Korean Intellectual Property Office, which is incorporated herein by reference in its entirety.

BACKGROUND

1. Technical Field

Embodiments of the present disclosure generally relate an integrated circuit, and more particularly to semiconductor device having an input/output (I/O) line drive circuit that performs an active operation during a refresh operation in accordance with a command/address signal and semiconductor systems including the semiconductor devices.

2. Related Art

A semiconductor memory device may include word lines, bit lines, and memory cells coupled the word lines and the bit lines. When the semiconductor memory device stores data in the memory cells and outputs the data stored in the memory cells, the word lines and the bit lines are used. That is, the semiconductor memory device may receive a command and an address to execute an active operation, which includes a write operation for storing data in the memory cells and a read operation for outputting the data. In a case of a dynamic random access memory (DRAM), each memory cell may include a single cell transistor and a single cell capacitor, and data may be stored in the cell capacitors of the memory cells. The word lines may be connected to gates of the cell transistors to control switching operations of the cell transistors.

In the active operation, one of the word lines is selected to receive the data or to output the data.

When one of the word lines is selected to receive or output the data, the selected word line may be driven with a high voltage. The cell transistors connected to the selected word line may be turned on by the high voltage applied to the gates of the cell transistors, and as a result, a charge sharing occurs between the cell capacitors and the bit lines connected to the selected word line through the turned-on cell transistors.

The recent developments of mobile devices are leading to advances in technologies for low-power DRAM devices. The technologies for low-power DRAM devices may include the current reduction during refresh operations.

Unlike static random access memory (SRAM) devices or flash memory devices, the DRAM devices may lose data stored in their memory cells as time elapses. In order to retain the data stored in the memory cells, the DRAM devices perform a refresh operation by periodically reading data stored in a memory cell and immediately rewriting the read data to the same memory cell. The amount of time that the memory cells can safely retain data without being refreshed is called a retention time. Usually, a refresh operation is carried out at least once in a retention time.

SUMMARY

Various embodiments are directed to semiconductor device having an input/output (I/O) line drive circuit and semiconductor systems including the same.

According to an embodiment, a semiconductor system includes a first semiconductor device and a second semiconductor device. The first semiconductor device is suitable for outputting a command/address signal. The second semiconductor device is suitable for extracting an active signal, a pre-charge signal, and addresses from the command/address signal, suitable for performing an active operation of a memory cell corresponding to the addresses, and suitable for performing a refresh operation of the memory cell corresponding to counting signals which are counted in response to a refresh signal.

According to another embodiment, an input and output line drive circuit includes an amplification unit, a first coupling unit, and a second coupling unit. The amplification unit is suitable for sensing and amplifying a voltage difference between a bit line and an inversion bit line which are coupled to a memory cell. The first coupling unit is suitable for coupling the bit line to a segment line in response to a column select signal and an enable signal. The second coupling unit is suitable for coupling the inversion bit line to an inversion segment line in response to the column select signal and the enable signal.

According to yet another embodiment, a semiconductor system includes a first semiconductor device and a second semiconductor device. The first semiconductor device is suitable for outputting a command/address signal and receiving a flag signal. The second semiconductor device is suitable for extracting an active signal, a pre-charge signal, and addresses from the command/address signal, suitable for performing an active operation of a memory cell corresponding to the addresses, suitable for performing a refresh operation of the memory cell corresponding to counting signals which are counted in response to a refresh signal, and suitable for outputting the flag signal which is enabled if the memory cells which are selected in the active operation and the refresh operation are included in the same mat.

According to yet another embodiment, the first semiconductor device delays an output time point of the command/address signal in response to the flag signal.

According to yet another embodiment, the refresh signal includes pulses which are periodically generated in accordance with a combination of the command/address signal.

According to yet another embodiment, the active operation and the refresh operation are operations in which a word line coupled to the memory cell is selected and a voltage difference between a pair of bit lines coupled to the memory cell is sensed and amplified.

According to yet another embodiment, the second semiconductor device includes an input buffer suitable for generating the active signal, the pre-charge signal, and the addresses in accordance with a combination of the command/address signal. a refresh signal generating unit suitable for generating the refresh signal in accordance with a combination of the command/address signal. a refresh control unit suitable for generating the counting signals which are counted in response to the active signal and the refresh signal, and suitable for generating the flag signal which is enabled if a combination of the addresses is the same as a combination of the counting signals, and a memory portion suitable for performing the active operation of the memory cell which is selected in accordance with a combination of the addresses in response to the active signal and the pre-charge signal, and suitable for performing the refresh operation of the memory cell which is selected in accordance with a combination of the counting signals.

According to yet another embodiment, the refresh control unit includes a counter suitable for generating internal counting signals which are sequentially counted in response to the refresh signal. a signal generating unit suitable for generating the flag signal which is enabled if a combination of the addresses is the same as a combination of the counting signals, a latch control signal, and a select signal in response to the refresh signal and the active signal. a latch unit suitable for latching the internal counting signals in response to the latch control signal, and suitable for outputting the latched internal counting signals as latch counting signals, and a select transmission unit suitable for outputting the internal counting signals or the latch counting signals as counting signals in response to the select signal.

According to yet another embodiment, the signal generating unit includes a control signal generating unit suitable for generating a first control signal which is enabled if a generation time point of the refresh signal is earlier than that of the active signal, and suitable for generating a second control signal which is enabled if a generation time point of the active signal is earlier than that of the refresh signal. a first comparison unit suitable for comparing the addresses to the counting signals to generate the flag signal in response to the first control signal, and a second comparison unit suitable for comparing the addresses to the internal counting signals to generate the latch control signal in response to the second control signal, and suitable for comparing the addresses to the latch counting signals to generate the select signal in response to the second control signal.

According to yet another embodiment, the memory portion decouples a pair of bit lines of the memory cell which is selected in accordance with a combination of the counting signals during the refresh operation, from an I/O line.

According to yet another embodiment, the memory portion includes a switching signal generating unit suitable for generating first and second switching signals and first and second column select signals which are selectively enabled by decoding the addresses and the counting signals. an enable signal generating unit suitable for generating first and second enable signals which are selectively disabled in accordance with a combination of the counting signals if the refresh signal is enabled. a first mat suitable for including a plurality of memory cells. a first sense amplifier suitable for being located in a first direction of the first mat, and suitable for controlling coupling of a pair of first bit lines which are coupled to the memory cell in response to the first column select signal and the first enable signal, and a pair of first segment lines, and a second sense amplifier suitable for being located in a second direction of the first mat, and suitable for controlling coupling of a pair of second bit lines which are coupled to the memory cell in response to the second column select signal and the second enable signal, and a pair of second segment lines.

According to yet another embodiment, the first sense amplifier includes a first amplification unit suitable for sensing and amplifying a voltage difference between a bit line and an inversion bit line which are coupled to the memory cell. a first coupling unit suitable for coupling the bit line to the segment line in response to the first column select signal and the first enable signal, and a second coupling unit suitable for coupling the inversion bit line to the inversion segment line in response to the first column select signal and the first enable signal.

According to yet another embodiment, the first coupling unit decouples the bit line from the segment line if the first enable signal is disabled during the refresh operation, and the second coupling unit decouples the inversion bit line from the inversion segment line if the first enable signal is disabled during the refresh operation.

According to yet another embodiment, the second sense amplifier includes a second amplification unit suitable for sensing and amplifying a voltage difference between a bit line and an inversion bit line which are coupled to the memory cell. a third coupling unit suitable for coupling the bit line to the segment line in response to the second column select signal and the second enable signal, and a fourth coupling unit suitable for coupling the inversion bit line to the inversion segment line in response to the second column select signal and the second enable signal.

According to yet another embodiment, the third coupling unit decouples the bit line from the segment line if the second enable signal is disabled during the refresh operation, and the fourth coupling unit decouples the inversion bit line from the inversion segment line if the second enable signal is disabled during the refresh operation.

According to yet another embodiment, the memory portion further includes a first switching unit suitable for coupling a pair of the first segment lines to a pair of the first I/O lines in response to the first switching signal, and a second switching unit suitable for coupling a pair of the second segment lines to a pair of the second I/O lines in response to the second switching signal.

According to yet another embodiment, a semiconductor device includes an input and output buffer, a refresh signal generating unit, a first bank, and a second bank. The input and output buffer is suitable for generating an active signal, a pre-charge signal, and addresses in accordance with a combination of a command/address signal. The refresh signal generating unit is suitable for generating a refresh signal which includes pulses that are periodically generated in accordance with a combination of the command/address signal. The first bank is suitable for performing an active operation of a memory cell corresponding to a combination of the addresses in response to the active signal and the pre-charge signal, and suitable for sequentially performing a refresh operation of the memory cell in response to the refresh signal. The second bank is suitable for performing an active operation of a memory cell corresponding to a combination of the addresses in response to the active signal and the pre-charge signal, and suitable for sequentially performing a refresh operation of the memory cell in response to the refresh signal.

According to yet another embodiment, the active operation and the refresh operation are operations in which a word line coupled to the memory cell is selected and a voltage difference between a pair of bit lines coupled to the memory cell is sensed and amplified.

According to yet another embodiment, the first bank decouples a first sense amplifier which senses and amplifies a voltage difference between a pair of the bit lines of the memory cell that is selected in accordance with a combination of first counting signals which are sequentially counted during the refresh operation, from a first I/O line, and the second bank decouples a second sense amplifier which senses and amplifies a voltage difference between a pair of the bit lines of the memory cell that is selected in accordance with a combination of second counting signals which are sequentially counted during the refresh operation, from a second I/O line.

According to yet another embodiment, the first bank includes a first switching signal generating unit suitable for generating first and second switching signals and first and second column select signals which are selectively enabled by decoding the addresses or first counting signals. a first enable signal generating unit suitable for generating first and second enable signals which are selectively disabled in accordance with a combination of the first counting signals if the refresh signal is enabled. a first mat suitable for including a plurality of memory cells. a first sense amplifier suitable for being located in a first direction of the first mat, and suitable for controlling coupling of a pair of first bit lines which are coupled to the memory cell, and a pair of first segment lines in response to the first column select signal and the first enable signal, and a second sense amplifier suitable for being located in a second direction of the first mat, and suitable for controlling coupling of a pair of second bit lines which are coupled to the memory cell, and a pair of second segment lines in response to the second column select signal and the second enable signal.

According to yet another embodiment, the first bank further includes a first refresh control unit suitable for generating first counting signals which are counted in response to the active signal and the refresh signal, and suitable for outputting a first internal flag signal which is enabled if a combination of the addresses is the same as a combination of the counting signals.

According to yet another embodiment, the first refresh control unit includes a first counter suitable for generating first internal counting signals which are sequentially counted in response to the refresh signal. a first signal generating unit suitable for generating the first flag signal which is enabled if a combination of the addresses is the same as a combination of the first counting signals, a first latch control signal, and a first select signal in response to the refresh signal and the active signal. a first latch unit suitable for latching the first internal counting signals in response to the first latch control signal, and suitable for outputting the latched first internal counting signals as first latch counting signals, and a first select transmission unit suitable for outputting the first internal counting signals or the first latch counting signals as first counting signals in response to the first select signal.

According to yet another embodiment, the second bank includes a second switching signal generating unit suitable for generating third and fourth switching signals and third and fourth column select signals which are selectively enabled by decoding the addresses or second counting signals. a second enable signal generating unit suitable for generating third and fourth enable signals which are selectively disabled in accordance with a combination of the second counting signals if the refresh signal is enabled. a second mat suitable for including a plurality of memory cells. a third sense amplifier suitable for being located in a first direction of the second mat, and suitable for controlling coupling of a pair of third bit lines which are coupled to the memory cell, and a pair of third segment lines in response to the third column select signal and the third enable signal, and a fourth sense amplifier suitable for being located in a second direction of the second mat, and suitable for controlling coupling of a pair of fourth bit lines which are coupled to the memory cell, and a pair of fourth segment lines in response to the second column select signal and the second enable signal.

According to yet another embodiment, the second bank further includes a second refresh control unit suitable for generating second counting signals which are counted in response to the active signal and the refresh signal, and suitable for outputting a second internal flag signal which is enabled if a combination of the addresses is the same as a combination of the counting signals.

According to yet another embodiment, the first refresh control unit includes a second counter suitable for generating second internal counting signals which are sequentially counted in response to the refresh signal. a second signal generating unit suitable for generating the second flag signal which is enabled if a combination of the addresses is the same as a combination of the second counting signals, a second latch control signal, and a second select signal in response to the refresh signal and the active signal. a second latch unit suitable for latching the second internal counting signals in response to the second latch control signal, and suitable for outputting the latched second internal counting signals as second latch counting signals, and a second select transmission unit suitable for outputting the second internal counting signals or the second latch counting signals as second counting signals in response to the second select signal.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

Various embodiments of the present disclosure will be described hereinafter with reference to the accompanying drawings. However, the embodiments described herein are for illustrative purposes only and are not intended to limit the scope of the present disclosure.

Figure 1:
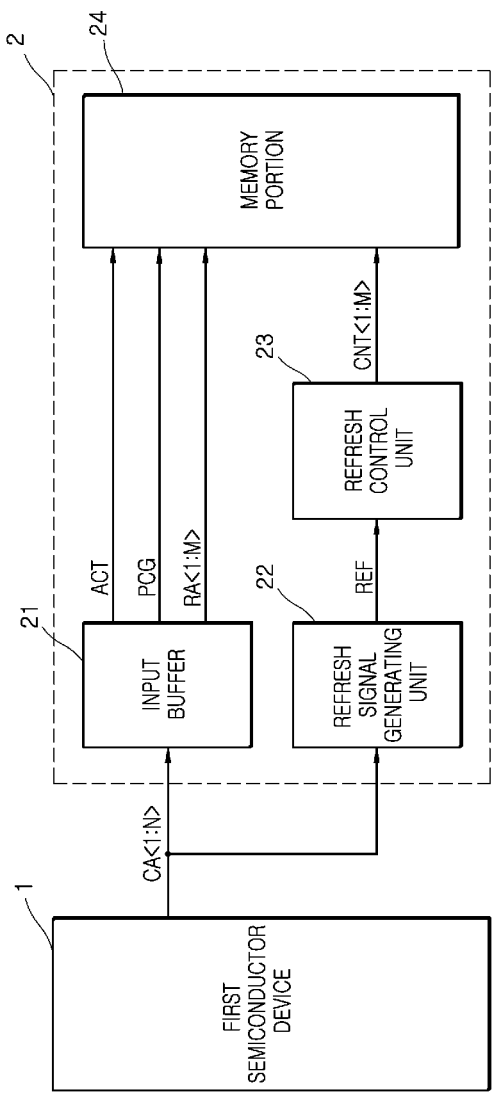
FIG. 1 is a block diagram illustrating a configuration of a semiconductor system according to an embodiment of the present disclosure.

As illustrated in FIG. 1, a semiconductor system according to an embodiment of the present disclosure may include a first semiconductor device 1 and a second semiconductor device 2. The second semiconductor device 2 may include an input buffer 21, a refresh signal generating unit 22, a refresh control unit 23, and a memory portion 24.

The first semiconductor device 1 may output command/address signals CA<LN>. The command/address signals CA<1:N> may be transmitted through signal lines. Addresses, commands, and data signals may be transmitted through separate signal lines. Alternatively, the command/ address signals CA<1:N> may be sequentially transmitted through a single line. The number of bits in the command/address signals CA<1:N> may vary according to embodiments.

The input buffer 21 may generate an active signal ACT, a pre-charge signal PCG, and addresses RA<1:M> in accordance with a combination of the command/address signals CA<LN>. A combination of the command/address signals CA<LN> for generating the active signal ACT and the pre-charge signal PCG may vary according to embodiments. In an embodiment, the addresses RA<1:M> may be partial bits in the command/address signals CA<LN>. In another embodiment, the addresses RA<1:M> may be generated from partial bits in the command/address signals CA<LN>. The number of bits in the addresses RA<1:M> may vary according to embodiments.

The refresh signal generating unit 22 may generate a refresh signal REF including pulses which are periodically generated in accordance with a combination of the command/address signals CA<1:N>. The pulse generation period of the refresh signal REF may vary according to embodiments. The refresh signal REF may be a signal that has a constant level while a refresh operation is performed. The refresh signal generating unit 22 may generate the refresh signal REF which includes pulses periodically generated after the semiconductor system enters a power-up period. Here, in the power-up period, a power supply voltage is applied to the semiconductor system, and the power supply voltage increases up to a predetermined voltage level.

The refresh control unit 23 may generate counting signals CNT<1:M> in response to the refresh signal REF. In an embodiment, the refresh control unit 23 may generate the counting signals CNT<1:M> by counting a number of pulses in a clock signal. For instance, the refresh signal REF may be the clock signal. The number of bits of the counting signals CNT<1:M> may vary according to embodiments.

The memory portion 24 may perform an active operation on a memory cell that is selected in accordance with a combination of the addresses RA<1:M> in response to the active signal ACT and the pre-charge signal PCG and may perform a refresh operation on a memory cell that is selected in accordance with the combination of the counting signals CNT<1:M>. In addition, during the refresh operation, the memory portion 24 may disconnect a pair of bit lines coupled to a memory cell that is selected in accordance with the combination of the counting signals CNT<1:M> from I/O lines. In the active operation, a word line coupled to a memory cell is selected, and a voltage difference between a pair of bit lines coupled to the memory cell is sensed and amplified or stored in the memory cell, and thereby data is read or written. In addition, in the refresh operation, a word line coupled to a memory cell is selected, a voltage difference between a pair of bit lines coupled to the memory cell is sensed and amplified, and the amplified data is rewritten to the memory cell within a retention time.

That is, the second semiconductor device 2 may extract the active signal ACT, the pre-charge signal PCG, and the addresses RA<1:M> from the command/address signals CA<1:N>, may perform the active operation on a memory cell that is selected by the addresses RA<1:M> from a generation time of the active signal ACT to a generation time of the pre-charge signal PCG, and may perform the refresh operation on the memory cell that is selected by the counting signals CNT<1:M> that is generated in response to the refresh signal REF.

Figure 2:
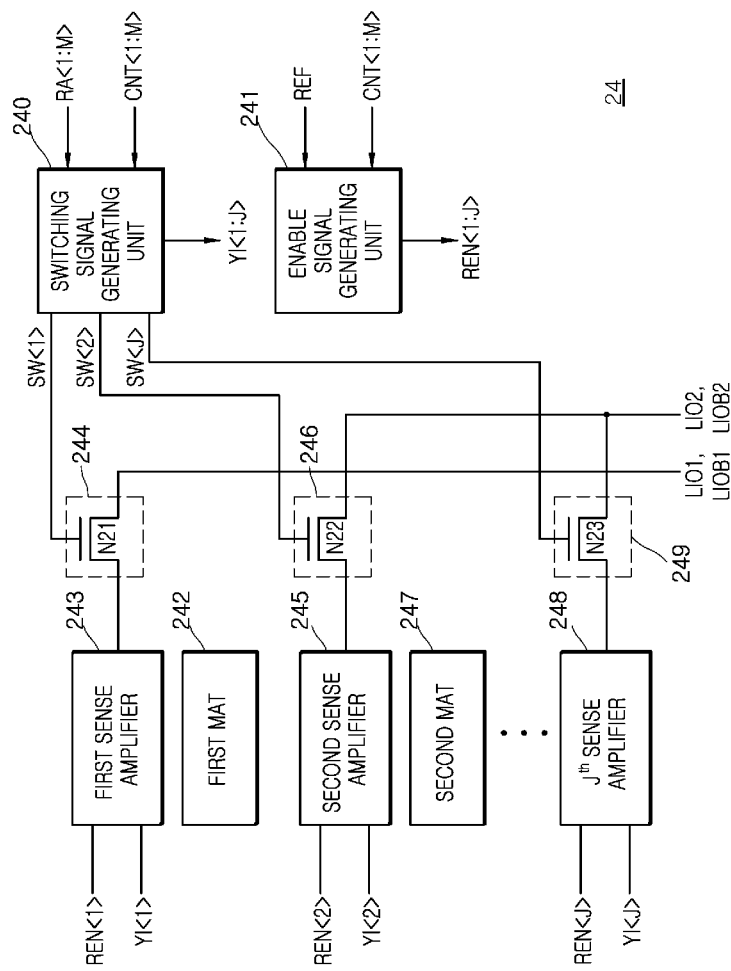
FIG. 2 is a block diagram illustrating a configuration of a memory portion included in a second semiconductor device of FIG. 1.

Referring to FIG. 2, the memory portion 24 may include a switching signal generating unit 240, an enable signal generating unit 241, a first mat 242, a first sense amplifier 243, a first switching unit 244, a second sense amplifier 245, a second switching unit 246, a second mat 247, a $J^{th}$ sense amplifier 248, and a $J^{th}$ switching unit 249.

The switching signal generating unit 240 may generate switching signals SW<1:3> and column select signals YI<1:3> which are selectively enabled by decoding the addresses RA<1:M> or the counting signals CNT<1:M>.

The enable signal generating unit 241 may generate an enable signals REN<1:J>, which is selectively disabled in accordance with a combination of the counting signals CNT<1:M>, in response to the refresh signal REF.

The first mat 242 may include a plurality of memory cells.

The first sense amplifier 243 may control coupling of a pair of bit lines coupled to a memory cell and a pair of segment lines in response to a first column select signal YI<1> and a first enable signal REN<1>. In addition, the first sense amplifier 243 may sense and amplify a voltage difference between a pair of bit lines coupled to a memory cell of the first mat 242. The first sense amplifier 243 may sense a voltage difference between one of the pairs of bit lines coupled to the memory cells of the first mat 242 and one of the pairs of bit lines coupled to the memory cells of another mat and amplify the sensed voltage difference.

The first switching unit 244 may include an NMOS transistor N21 that couples a pair of segment lines included in the first sense amplifier 243 to a pair of first I/O lines LIO1 and LIOB1 in response to a first switching signal SW<1>. Although the first switching unit 244 is illustrated as a single transistor in FIG. 2 for the purpose of ease and convenience in explanation, the first switching unit 244 may be realized to include two transistors coupling respectively the pair of the segment lines and to the pair of the first I/O lines LIO1 and LIOB1 in response to the first switching signal SW<1>.

The second sense amplifier 245 may control coupling of a pair of bit lines coupled to a memory cell and a pair of segment lines in response to a second column select signal YI<2> and a second enable signal REN<2>. In addition, the second sense amplifier 245 may sense and amplify a voltage difference between a pair of bit lines coupled to a memory cell of the first mat 242 of the second mat 247. The second sense amplifier 245 may sense a voltage difference between one of the pairs of bit lines coupled to the memory cells of the first mat 242 and one of the pairs of bit lines coupled to the memory cells of second mat 247 and amplify the sensed voltage difference.

The second switching unit 246 may include an NMOS transistor N22 that couples a pair of segment lines included in the second sense amplifier 245 to a pair of second I/O lines LIO2 and LIOB2 in response to a second switching signal SW<2>. Although the second switching unit 246 is illustrated as a single transistor in FIG. 2 for the purpose of ease and convenience in explanation, the second switching unit 246 may be realized to include two transistors coupling respectively the pair of the segment lines and to the pair of the second I/O lines LIO2 and LIOB2 in response to the second switching signal SW<2>.

The second mat 247 may include a plurality of memory cells.

The $J^{th}$ sense amplifier 248 may control coupling of a pair of bit lines coupled to a memory cell and a pair of segment lines in response to a $J^{th}$ column select signal YI<J> and a $J^{th}$ enable signal REN<J>. In addition, the $J^{th}$ sense amplifier 248 may sense and amplify a voltage difference between a pair of bit lines coupled to a memory cell of the $J^{th}$ mat (not illustrated) of the second mat 247. The $J^{th}$ sense amplifier 248 may sense a voltage difference between one of the pairs of bit lines coupled to the memory cells of the $J^{th}$ mat (not illustrated) and one of the pairs of bit lines coupled to the memory cells of another mat and amplify the sensed voltage difference.

The $J^{th}$ switching unit 249 may include an NMOS transistor N23 that couples a pair of segment lines included in the $J^{th}$ sense amplifier 248 to a pair of the second I/O lines LIO2 and LIOB2 in response to the $J^{th}$ switching signal SW<J>. Although the $J^{th}$ switching unit 249 is illustrated as a single transistor in FIG. 2 for the purpose of ease and convenience in explanation, the $J^{th}$ switching unit 249 may be realized to include two transistors coupling respectively the pair of the segment lines and to the pair of the second I/O lines LIO2 and LIOB2 in response to the $J^{th}$ switching signal SW<J>.

Although not illustrated in FIG. 2 the memory portion 24 may include a third to $(J-1)^{th}$ mat, a third to $(J-1)^{th}$ sense amplifier, and a third to $(J-1)^{th}$ switching unit, and a number of mats and sense amplifiers in the memory portion 24 may vary according to embodiments. In addition, the memory portion 24 may be split into multiple banks each having the configuration illustrated in FIG. 2.

Figure 3:
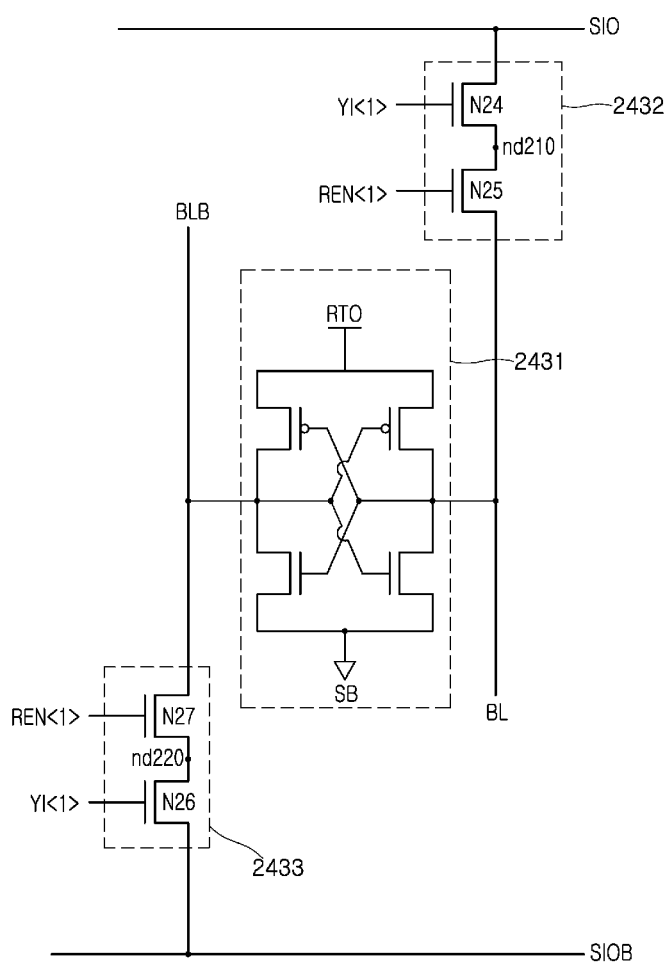
FIG. 3 is a circuit diagram illustrating a configuration of a first sense amplifier included in the memory portion of FIG. 2.

Referring to FIG. 3, the first sense amplifier 243 may include an amplification unit 2431, a first coupling unit 2432, and a second coupling unit 2433.

The amplification unit 2431 may receive an RTO voltage and an SB voltage, and may sense and amplify a voltage difference between a bit line BL and an inversion bit line BLB. Here, the RTO voltage may be set to a power supply voltage, which is input from an external device, or an internal voltage, which is generated by an internal unit of a semiconductor device, according to embodiments. In addition, the SB voltage may be set to a ground voltage according to embodiments.

The first coupling unit 2432 may include a first switch N24 which is coupled between a segment line SIO and a node nd210 and is turned on in response to a first column select signal YI<1>, and a second switch N25 which is coupled between the node nd210 and the bit line BL and is turned on in response to a first enable signal REN<1>. The first switch N24 and the second switch N25 may include NMOS transistors.

That is, if the first column select signal YI<1> and the first enable signal REN<1> have a logic high level, the first coupling unit 2432 may couple the bit line BL to the segment line SIO.

The second coupling unit 2433 may include a third switch N26 which is coupled between an inversion segment line SIOB and a node nd220 and is turned on in response to the first column select signal YI<1>, and a fourth switch N27 which is coupled between the node nd220 and an inversion bit line BLB and is turned on in response to the first enable signal REN<1>. The third switch N26 and the fourth switch N27 may include NMOS transistors.

That is, if the first column select signal YI<1> and the first enable signal REN<1> are input as a logic high level, the second coupling unit 2433 may couple the inversion bit line BLB to the inversion segment line SIOB.

The second to $J^{th}$ sense amplifiers 245 and 248 have the same configurations as the first sense amplifier 243 except for an input signal, and perform the same operation as the first sense amplifier 243. Thus, detailed description thereof will be omitted.

An operation that may be performed on the memory system having the aforementioned configuration will be described as follows, and an example in which, while a selected memory cell of the first mat performs a refresh operation, a memory cell of the second mat which is selected by a command/address signal performs an active operation will be described as follows.

The first semiconductor device 1 may output the command/address signals CA<1:N>.

The input buffer 21 may generate the active signal ACT in accordance with a combination of the command/address signals CA<LN>, and may generate the addresses RA<1:M> for selecting a memory cell of the second sense amplifier 245 from the command/address signals CA<1:N>.

The refresh signal generating unit 22 may generate the refresh signal REF which includes pulses that are periodically generated in order to enter a refresh operation in accordance with a combination of the command/address signals CA<1:N>.

The refresh control unit 23 may generate the counting signals CNT<1:M> in response to the refresh signal REF. In an embodiment, the refresh control unit 23 may generate the counting signals CNT<1:M> by counting a number of pulses in a clock signal. For instance, the refresh signal REF may be the clock signal.

The switching signal generating unit 240 of the memory portion 24 may generate the first switching signal SW<1> and the first column select signal YI<1> which are enabled by the counting signals CNT<1:M>. In addition, the switching signal generating unit 240 may generate the third switching signal SW<3> and the third column select signal YI<3> using the addresses RA<1:M>.

The enable signal generating unit 241 may generate a disabled first enable signal REN<1> by the counting signals CNT<1:M> in response to the refresh signal REF. Here, the second to $J^{th}$ enable signals REN<2:3> are all enabled.

The amplification unit 2431 of the first sense amplifier 243 may receive the RTO voltage and the SB voltage, and may sense and amplify a voltage difference between the bit line BL and the inversion bit line BLB.

The first coupling unit 2432 of the first sense amplifier 243 may decouple the bit line BL from the segment line SIO in response to a disabled first enable signal REN<1>.

The second coupling unit 2433 of the first sense amplifier 243 may decouple the inversion bit line BLB from the inversion segment line SIOB in response to the disabled first enable signal REN<1>.

That is, the first sense amplifier 243 may sense the voltage difference between a pair of the bit lines BL and BLB, and may decouple a pair of the bit lines BL and BLB from a pair of segment lines SIO and SIOB and amplify the sensed voltage difference.

The first switching unit 244 may couple a pair of the segment lines SIO and SIOB included in the first sense amplifier 243 to a pair of the I/O lines LIO1 and LIOB1 in response to an enabled first switching signal SW<1>.

An amplification unit (not illustrated) of a third sense amplifier (not illustrated) may receive the RTO voltage and the SB voltage, and may sense and amplify a voltage difference between the bit line BL and the inversion bit line BLB.

A fifth coupling unit (not illustrated) of a third sense amplifier (not illustrated) may couple the bit line BL to the segment line SIO in response to an enabled third enable signal REN<3>.

A sixth coupling unit (not illustrated) of the third sense amplifier (not illustrated) may couple the inversion bit line BLB to the inversion segment line SIOB in response to the enabled third enable signal REN<3>.

That is, the third sense amplifier (not illustrated) may sense and amplify the voltage difference between a pair of the bit lines BL and BLB, and may couple a pair of the bit lines BL and BLB to a pair of the segment lines SIO and SIOB.

A third switching unit (not illustrated) may couple a pair of the segment lines SIO and SIOB included in the third sense amplifier (not illustrated) to a pair of the I/O lines LIO1 and LIOB1 in response to an enabled third switching signal SW<3>.

The semiconductor system having the aforementioned configuration may prevent an active operation error from occurring during the refresh operation by decoupling a bit line coupled to a memory cell performing a refresh operation from an I/O line through which an active operation is performed.

Figure 4:
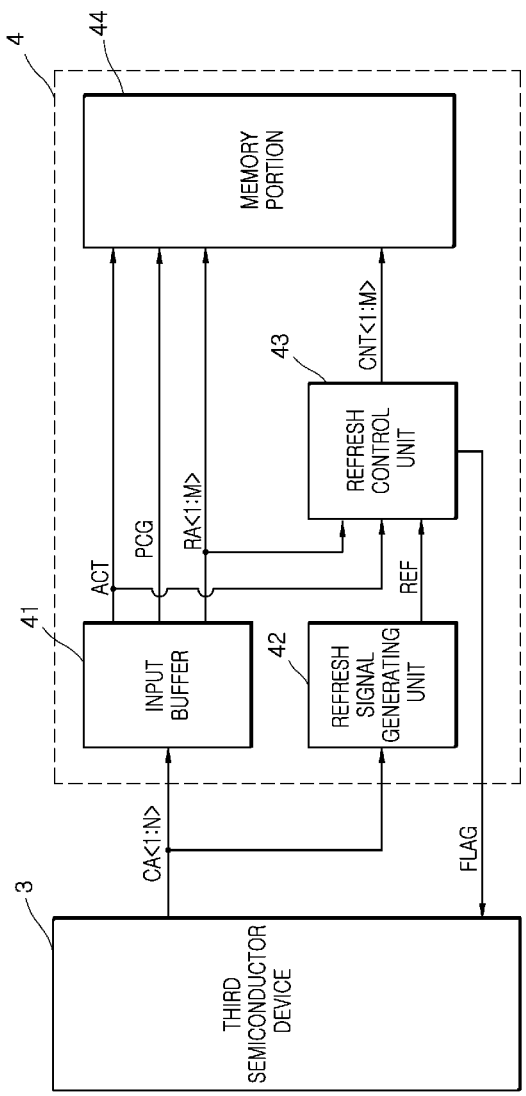
FIG. 4 is a block diagram illustrating a configuration of a semiconductor system according to an embodiment of the present disclosure.

As illustrated in FIG. 4, a semiconductor system according to an embodiment of the present disclosure may include a third semiconductor device 3 and a fourth semiconductor device 4. The fourth semiconductor device 4 may include an input buffer 41, a refresh signal generating unit 42, a refresh control unit 43, and a memory portion 44.

The third semiconductor device 3 may output command/address signals CA<1:N>, receive a flag signal FLAG, and delay a point in time when the command/address signals CA<LN> is outputted. In addition, the command/address signals CA<LN> may be continuously transmitted through a line. The number of bits in the command/address signals CA<1:N> may vary according to embodiments.

The input buffer 41 may generate an active signal ACT, a pre-charge signal PCG, and addresses RA<1:M> in accordance with a combination of the command/address signals CA<LN>. A combination of the command/address signals CA<LN> for generating the active signal ACT and the pre-charge signal PCG may be set in various ways according to embodiments. In an embodiment, the addresses RA<1:M> may be partial bits in the command/address signals CA<1:N>. In another embodiment, the addresses RA<1:M> may be generated from partial bits in the command/address signals CA<1:N>. The number of bits in the addresses RA<1:M> may vary according to embodiments.

The refresh signal generating unit 42 may generate a refresh signal REF including pulses which are periodically generated in accordance with a combination of the command/address signals CA<1:N>. The pulse generation period of the refresh signal REF may vary according to embodiments. The refresh signal REF may be a signal having a constant level while the refresh operation is performed. The refresh signal generating unit 42 may generate the refresh signal REF including pulses that are periodically generated after a power-up period in which the semiconductor system prepares to start operations thereof. Here, in the power-up period, the level of a power supply voltage, which is input to the semiconductor system from an external device, reaches a predetermined level.

The refresh control unit 43 may generate the counting signals CNT<1:M> in response to the refresh signal REF, and generate the flag signal FLAG which is enabled if a combination of the addresses RA<1:M> is the same as a combination of the counting signals CNT<1:M>. Here, the refresh control unit 43 may generate counting signals CNT<1:M> by counting a number of pulses in a clock signal. For instance, the refresh signal REF may be the clock signal. The number of bits of the counting signals CNT<1:M> may vary according to embodiments.

The memory portion 44 may perform an active operation on a memory cell selected in accordance with a combination of the addresses RA<1:M> in response to the active signal ACT and the pre-charge signal PCG, and may perform a refresh operation on a memory cell selected in accordance with the combination of the counting signals CNT<1:M>. In addition, during the refresh operation, the memory portion 44 may decouple, from an I/O line, a pair of bit lines coupled to a memory cell that is selected in accordance with the combination of the counting signals CNT<1:M>. In the active operation, a word line coupled to a memory cell is selected, and a voltage difference between a pair of bit lines coupled to the memory cell is sensed and amplified or stored in the memory cell, and thereby data is read or written. In addition, in the refresh operation, a word line coupled to a memory cell is selected, a voltage difference between a pair of bit lines coupled to the memory cell is sensed and amplified within a retention time, and the amplified data is rewritten to the memory cell within a retention time.

That is, the second semiconductor device 4 may extract the active signal ACT, the pre-charge signal PCG, and the addresses RA<1:M> from the command/address signals CA<1:N>, may perform the active operation on a memory cell that is selected by the addresses RA<1:M> from a generation time of the active signal ACT to a generation time of the pre-charge signal PCG, and may perform the refresh operation on a memory cell that is selected by the counting signals CNT<1:M>, which is generated in response to the refresh signal REF. In addition, if the memory cells that are selected in the active operation and the refresh operation are included in the same mat, the fourth semiconductor device 4 may generate the enabled flag signal FLAG.

Figure 5:
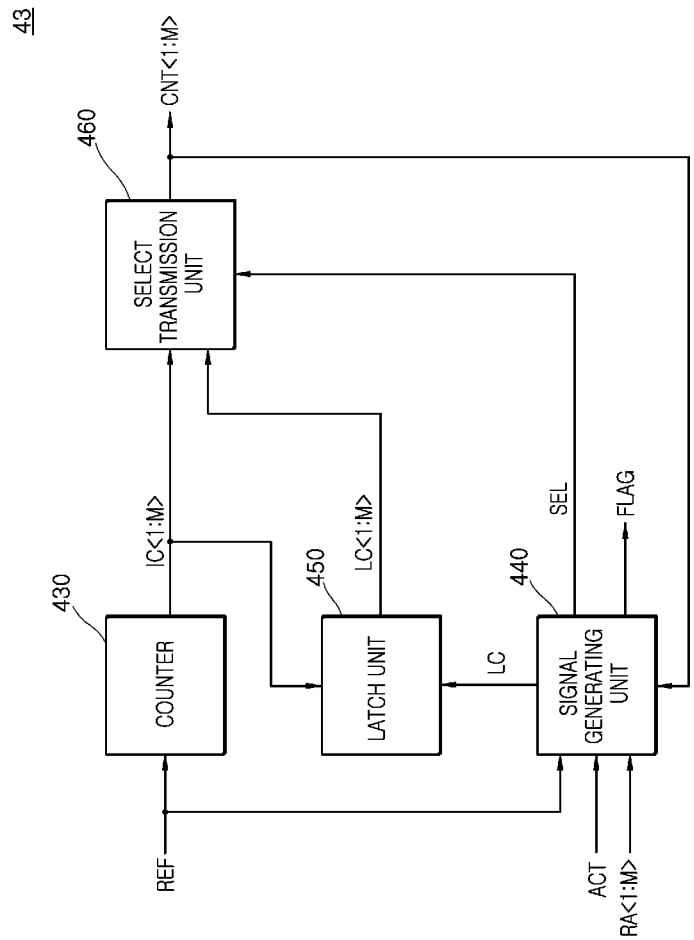
FIG. 5 is a block diagram illustrating a configuration of a refresh control unit included in a fourth semiconductor device of FIG. 4.

Referring to FIG. 5, the refresh control unit 43 may include a counter 430, a signal generating unit 440, a latch unit 450, and a select transmission unit 460.

The counter 430 may generate internal counting signals IC<1:M> in response to the refresh signal REF. In an embodiment, the counter 430 may generate the internal counting signals IC<1:M> by counting a number of pulses in a clock signal. For instance, the refresh signal REF may be the clock signal.

The signal generating unit 440 may generate the enabled flag signal FLAG, a latch control signal LC, and a select signal SEL in response to the refresh signal REF and the active signal ACT The flag signal FLAG may be enabled if a combination of the addresses RA<1:M> is the same as a combination of the counting signals CNT<1:M>.

The latch unit 450 may temporarily store the internal counting signals IC<1:M> in response to the latch control signal LC, and output the stored internal counting signals IC<1:M> as latch counting signals LC<1:M>.

The select transmission unit 460 may output the internal counting signals IC<1:M> or the latch counting signals LC<1:M> as the counting signals CNT<1:M> in response to the select signal SEL.

That is, the refresh control unit 43 may generate the counting signals CNT<1:M> in response to the refresh signal REF, and generate the flag signal FLAG which is enabled if a combination of the addresses RA<1:M> is the same as a combination of the counting signals CNT<1:M>. In an embodiment, the refresh control unit 43 may generate the counting signals CNT<1:M> by counting a number of pulses in a clock signal. For instance, the refresh signal REF may be the clock signal.

Figure 6:
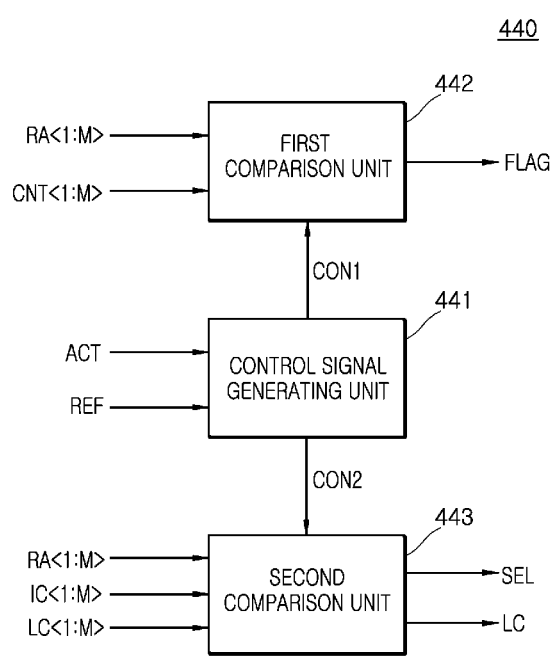
FIG. 6 is a block diagram illustrating a configuration of a signal generating unit included in the refresh control unit of FIG. 5.

Referring to FIG. 6, the signal generating unit 440 may include a control signal generating unit 441, a first comparison unit 442, and a second comparison unit 443.

The control signal generating unit 441 may generate a first control signal CON1 which is enabled if a point in time when the refresh signal REF is generated is earlier than a point in time when the active signal ACT is generated, and generate a second control signal CON2 which is enabled if the point in time when the refresh signal ACT is generated is earlier than the point in time when the active signal REF is generated.

The first comparison unit 442 may compare the addresses RA<1:M> to the counting signals CNT<1:M> in response to the first control signal CON1, and generate the flag signal FLAG.

The second comparison unit 443 may generate the latch control signal LC by comparing the addresses RA<1:M> to the internal counting signals IC<1: M> in response to the second control signal CON2, and generate the select signal SEL by comparing the addresses RA<1:M> to the latch counting signals LC<1:M>.

That is, the signal generating unit 440 may generate the flag signal FLAG, if a point in time when the refresh signal REF is generated is earlier than a point in time when the active signal ACT is generated and a combination of the addresses RA<1:M> is the same as a combination of the counting signals CNT<1:M>. In addition, the signal generating unit 440 may enable the latch control signal LC if the point in time when the active signal ACT is generated is earlier than the point in time when the refresh signal REF is generated and a combination of the addresses RA<1:M> is the same as a combination of the internal counting signals IC<1:M>, and generate the select signal SEL which is enabled if a combination of the addresses RA<1:M> is the same as a combination of the latch counting signals LC<1:M>.

Figure 7:
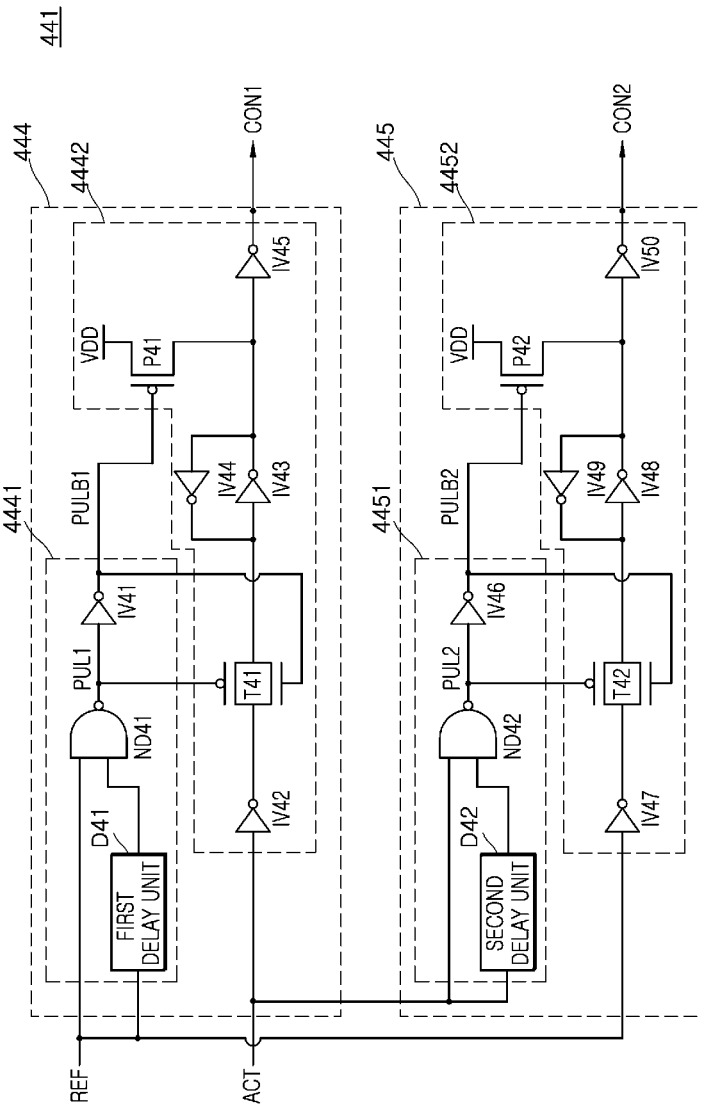
FIG. 7 is a circuit diagram illustrating a configuration of a control signal generating unit included in the signal generating unit of FIG. 6.

Referring to FIG. 7, the control signal generating unit 441 may include a first control signal generating unit 444 and a second control signal generating unit 445.

The first control signal generating unit 444 may include a first pulse signal generating unit 4441 and a first transmission unit 4442.

The first pulse signal generating unit 4441 may include a first delay unit D41, a NAND gate ND41, and an inverter IV41, and generate a first pulse signal PUL1 having a logic low level and a first inversion pulse signal PULB1 having a logic high level if the refresh signal REF is input as a signal having a logic high level. Here, the first inversion pulse signal PULB1 may be an inverted signal of the first pulse signal PUL1.

The first transmission unit 4442 may include inverters IV42, IV43, IV44, and IV45, a transmission gate T41, and a PMOS transistor P41. The first transmission unit 4442 may generate a disabled first control signal CON1, which has a logic low level, if the first inversion pulse signal PULB1 has a logic low level, and generate an enabled first control signal CON1, which has a logic high level, by inverting the active signal ACT if the first pulse signal PUL1 has a logic low level.

The second control signal generating unit 445 may include a second pulse signal generating unit 4451 and a second transmission unit 4452.

The second pulse signal generating unit 4451 may include a second delay unit D42, a NAND gate ND42, and an inverter IV46, and generate a second pulse signal PUL2 having a logic low level and a second inversion pulse signal PULB2 having a logic high level if the active signal ACT is input as a signal having a logic high level. Here, the second inversion pulse signal PULB2 may be an inverted signal of the second pulse signal PUL2.

The second transmission unit 4452 may include inverters IV47, IV48, IV49, and IV50, a transmission gate T42, and a PMOS transistor P42, generate a disabled second control signal CON2, which has a logic low level, if the second inversion pulse signal PULB2 has a logic low level, and generate an enabled second control signal CON2, which has a logic high level, by inverting the refresh signal REF if the second pulse signal PUL2 has a logic low level.

The memory portion 44 according to an embodiment of the present disclosure illustrated in FIG. 4 may have the same configuration as the memory portion 24, and performs the same operation as the memory portion 24. Thus, detailed description thereof will be omitted.

An operation that may be performed on the memory system having the aforementioned configuration will be described as follows, and an example in which a memory cell that is selected in the refresh operation and a memory cell that is selected in the active operation are located in the same mat and the refresh operation is performed earlier than the active operation will be described as follows.

The third semiconductor device 3 may output the command/address signals CA<1:N>.

The input buffer 41 may generate the active signal ACT in accordance with a combination of the command/address signals CA<1:N>, and generate the addresses RA<1:M> from the command/address signals CA<1:N>. The combination of the addresses RA<1:M> may be generated as a combination for selecting the memory cell in the same mat as a mat that has the memory cell selected in the refresh operation.

The refresh signal generating unit 42 may generate the refresh signal REF, which includes pulses that are periodically generated in order to enter a refresh operation.

The counter 430 of the refresh control unit 23 may generate the internal counting signals IC<1:M> by counting the number of pulses in the refresh signal REF.

The select transmission unit 460 may transmit the internal counting signals IC<1:M> as the counting signals CNT<1:M>.

Since a point in time when the refresh signal REF is generated is earlier than a point in time when the active signal ACT is generated, the control signal generating unit 441 of the signal generating unit 440 may generate the enabled first control signal CON1, which has a logic high level.

Since the combination of the addresses RA<1:M> is the same as the combination of the counting signals CNT<1:M>, the first comparison unit 442 may enable the flag signal FLAG.

The second comparison unit 443 may not generate the select signal SEL and the latch control signal LC in response to a disabled second control signal CON2.

The memory portion 44 may perform the refresh operation on the memory cell selected in accordance with the combination of the counting signals CNT<1:M>.

The third semiconductor device 3 may receive the flag signal FLAG, and delay an output timing of the command/address signals CA<1:N>.

The input buffer 41 may generate the active signal ACT in accordance with the combination of the command/address signals CA<1:N>, and generate the addresses RA<1:M> from the command/address signals CA<1:N>.

The memory portion 44 may perform the active operation on the memory cell selected in accordance with the combination of the addresses RA<1:M> in response to the active signal ACT. The activated memory cell is a memory cell that has terminated the refresh operation thereof.

The semiconductor system having the aforementioned configuration may prevent an active operation error from occurring during the refresh operation by delaying the refresh operation if the timing that the active operation is performed is earlier than the timing that the refresh operation is performed, or by delaying the active operation if the timing that the refresh operation is performed is earlier than the timing that the active operation is performed, in a case in which a memory cell that is selected in the refresh operation and a memory cell that is selected in the active operation are located together in a mat of the same bank.

Figure 8:
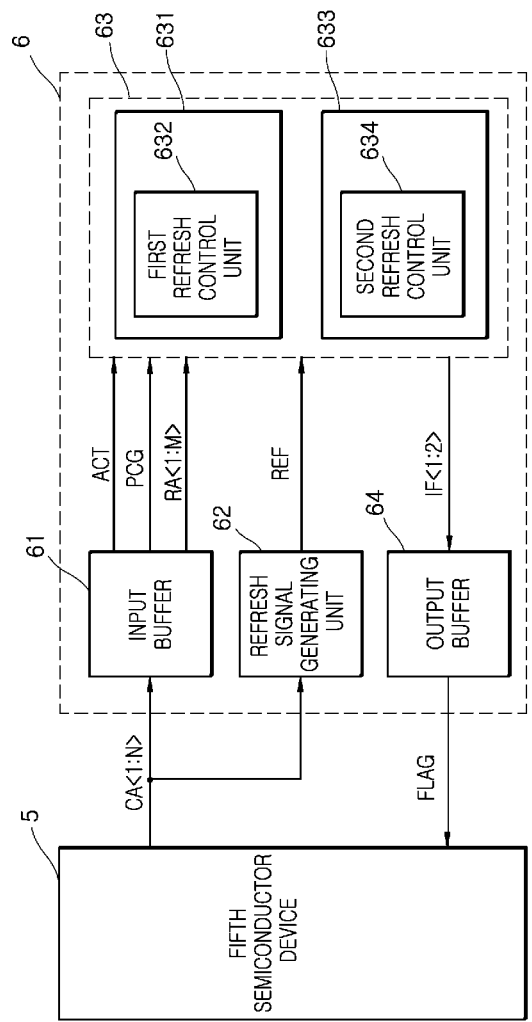
FIG. 8 is a block diagram illustrating a configuration of a semiconductor system according to an embodiment of the present disclosure.

As illustrated in FIG. 8, a semiconductor system according to an embodiment of the present disclosure may include a fifth semiconductor device 5 and a sixth semiconductor device 6. The sixth semiconductor device 6 may include an input buffer 61, a refresh signal generating unit 62, a memory portion 63, and an output buffer 64.

The fifth semiconductor device 5 may output the command/address signals CA<1:N>, receive the flag signal FLAG, and delay an output time point of the command/address signals CA<LN>. In addition, the command/address signals CA<LN> may be continuously transmitted through a signal line. The number of bits of the command/address signals CA<1:N> may vary according to embodiments.

The input buffer 61 may generate an active signal ACT, a pre-charge signal PCG, and addresses RA<1:M> in accordance with a combination of the command/address signals CA<LN>. A combination of the command/address signals CA<1:N> for generating the active signal ACT and the pre-charge signal PCG may be set in various ways according to embodiments. The addresses RA<1:M> may be partial bits in the command/address signals CA<LN>. In another embodiment, the addresses RA<1:M> may be generated from partial bits in the command/address signals CA<LN>. The number of bits of the addresses RA<1:M> may vary according to embodiments.

The refresh signal generating unit 62 may generate a refresh signal REF including pulses periodically generated in accordance with a combination of the command/address signals CA<LN>. The pulse generation period of the refresh signal REF may vary according to embodiments. The refresh signal REF may be a signal having a constant level while the refresh operation is performed. The refresh signal generating unit 62 may generate the refresh signal REF, which includes pulses periodically generated after a power-up period. Here, the power-up period may a period in which the level of a power supply voltage that is input to the semiconductor system from an external device reaches a predetermined level.

The memory portion 63 may include a first bank 631 and a second bank 633. The first bank 631 may include a first refresh control circuit 632, and the second bank 633 may include a second refresh control circuit 634.

In response to the active signal ACT and the pre-charge signal PCG, the first bank 631 may perform an active operation on a memory cell that is selected in accordance with a combination of the addresses RA<1:M>. In response to the refresh signal REF, the first bank 631 may perform a refresh operation on a memory cell that is selected in accordance with a combination of the counting signals CNT<1:M>. In addition, during the refresh operation, the first bank 631 may decouple, from an I/O line, a pair of bit lines coupled to the memory cell that is selected in accordance with a combination of the counting signals CNT<1:M>.

In an embodiment, a first refresh control unit 632 of the first bank 631 may generate the counting signals CNT<1:M> by counting the number of pulses in the refresh signal REF, and may generate a first internal flag signal IF<1> which is enabled if a combination of the addresses RA<1:M> is the same as a combination of the counting signals CNT<1:M>. The first refresh control unit 632 may include the same circuit as the refresh control unit 43 illustrated in FIG. 5 except for an input and output signal and may perform the same operation as the refresh control unit 43. Thus, detailed description thereof will be omitted.

In response to the active signal ACT and the pre-charge signal PCG, the second bank 633 may perform an active operation on a memory cell that is selected in accordance with a combination of the addresses RA<1:M>. In response to the refresh signal REF, the second bank 633 may perform a refresh operation on a memory cell that is selected in accordance with a combination of the counting signals CNT<1:M>. In addition, during the refresh operation, the second bank 633 may decouple, from an I/O line, a pair of bit lines coupled to the memory cell selected in accordance with a combination of the counting signals CNT<1:M>.

In an embodiment, a second refresh control unit 634 of the second bank 633 may generate the counting signals CNT<1:M> by counting the number of pulses in the refresh signal REF, and may generate a second internal flag signal IF<2> which is enabled if a combination of the addresses RA<1:M> is the same as a combination of the counting signals CNT<1:M>. The second refresh control unit 634 may include the same circuit as the refresh control unit 43 illustrated in FIG. 5 except for an input and output signal, and performs the same operation as the refresh control unit 43. Thus, detailed description thereof will be omitted. The first and second internal flag signal IF<1:2> may include the first internal flag signal IF<1> and the second internal flag signal IF<2>.

The output buffer 64 may output the flag signal FLAG which is enabled if one of the first internal flag signal IF<1> and the second internal flag signal IF<2> is enabled.

The semiconductor system having the aforementioned configuration may prevent an active operation error from occurring during the refresh operation by delaying the refresh operation if the active operation is first performed, or by delaying the active operation if the refresh operation is first performed, in a case in which a memory cell that is selected in the refresh operation and a memory cell that is selected in the active operation are located together in a mat of the same bank.

Figure 9:
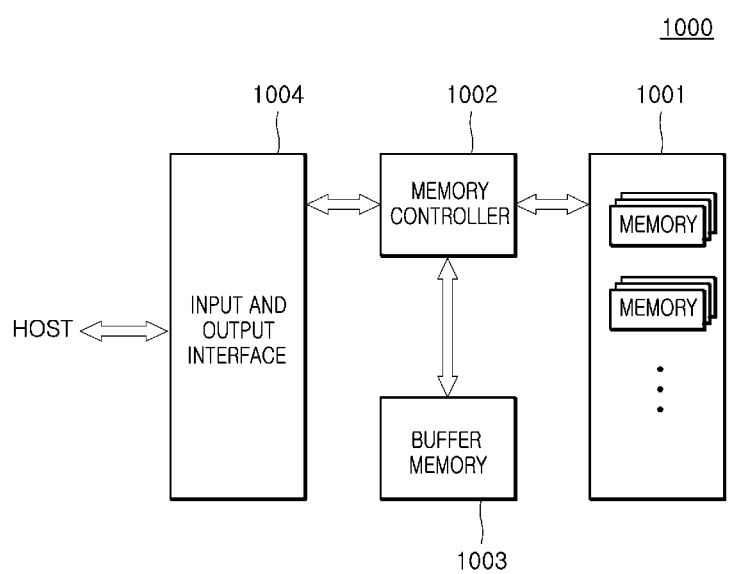
FIG. 9 illustrates a configuration of an electronic system employing at least one of the semiconductor devices or the semiconductor systems illustrated in FIGS. 1 to 8.

The semiconductor device and the semiconductor system which are described with reference to FIG. 1 to FIG. 8 may be applied to any electronic system that includes a memory system, a graphic system, a computing system, a mobile system, and the like. For example, referring to FIG. 9, an electronic system 1000 according to an embodiment of the present disclosure may include a data storage unit 1001, a memory controller 1002, a buffer memory 1003, and an input/output (I/O) interface 1004.

The data storage unit 1001 may store data that is input from the memory controller 1002 in accordance with a control signal from the memory controller 1002, and output the stored data to the memory controller 1002. The data storage unit 1001 may include the second semiconductor device 2 illustrated in FIG. 1, the fourth semiconductor device 4 illustrated in FIG. 4, and the sixth semiconductor device 6 illustrated in FIG. 8. The data storage unit 1001 may include a non-volatile memory, which retain data even in the absence of power supplies. The non-volatile memory may include one or more of a flash memory (e.g., NOR flash memory and NAND flash memory), a phase change random access memory (PRAM), a resistive random access memory (RRAM), a spin transfer torque random access memory (STTRAM), or a magnetic random access memory (MRAM).

The memory controller 1002 may decode a command which is applied from an external device HOST through the I/O interface 1004, and control an input to and an output from the data storage unit 1001 and the buffer memory 1003 in accordance with the result of the decoding operation. The memory controller 1002 may include the first semiconductor device 1 illustrated in FIG. 1, the fourth semiconductor device 4 illustrated in FIG. 4, and the sixth semiconductor device 6 illustrated in FIG. 8. The memory controller 1002 is illustrated by one block in FIG. 9, but the memory controller 1002 may be a controller for controlling a non-volatile memory and a controller for controlling the buffer memory 1003 (e.g., a volatile memory).

The buffer memory 1003 may temporarily store data processed by the memory controller 1002 such as data input to and output from the data storage unit 1001. The buffer memory 1003 may store data that is input by the memory controller 1002 in accordance with a control signal. The buffer memory 1003 may output the stored data to the memory controller 1002. The buffer memory 1003 may include a volatile memory such as a dynamic random access memory (DRAM), a mobile DRAM, or a static random access memory (SRAM).

The I/O interface 1004 may couple the memory controller 1002 to the external device HOST, and thereby the memory controller 1002 may receive a control signal for inputting and outputting data to and from the external device HOST, and exchange the data with the external device. The I/O interface 1004 may include one of various interface protocols, such as USB, MMC, PCI-E, SAS, SATA, PATA, SCSI, ESDI, and IDE.

The electronic system 1000 may be used as an auxiliary storage device of a host, or an external storage device. The electronic system 1000 may include a solid state disk (SSD), a universal serial bus (USB) memory, a secure digital (SD) card, a mini secure digital (mSD) card, a micro secure digital (SD) card, a secure digital high capacity (SDHC) card, a memory stick card), a smart media (SM) card, a multi-media card (MMC), an embedded MMC (eMMC), a compact flash (CF) card, or the like.

The semiconductor system having aforementioned configuration may prevent an active operation during a refresh operation by performing the refresh operation using an internally-generated refresh signal, and by performing the active operation in accordance with a command/address signal.

In addition, the semiconductor may prevent an active operation error from occurring during the refresh operation by decoupling a bit line coupled to a memory cell performing a refresh operation from an I/O line to decouple the bit line through which the refresh operation is performed from the I/O line through which an active operation is performed.

In addition, the semiconductor system may prevent an active operation error from occurring during the refresh operation by delaying the refresh operation if the timing that the active operation is performed is earlier than the timing that the refresh operation is performed, or by delaying the active operation if the timing that the refresh operation is performed is earlier than the timing that the active operation is performed, in a case in which a memory cell that is selected in the refresh operation and a memory cell that is selected in the active operation are located together in a mat of the same bank.

What is claimed is:

1. A semiconductor system comprising:
    a first semiconductor device suitable for outputting a command/address signal; and
    a second semiconductor device suitable for extracting an active signal, a pre-charge signal, and addresses from the command/address signal, performing an active operation on a memory cell corresponding to the addresses, and performing a refresh operation on the memory cell corresponding to counting signals generated by counting a number of pulses in a refresh signal,
    wherein the second semiconductor device includes a memory portion,
    wherein, during the refresh operation, the memory portion decouples, from an I/O line, a pair of bit lines of the memory cell selected in accordance with a logic level combination of the counting signals.

2. The system of claim 1, wherein the refresh signal includes pulses periodically generated in accordance with a logic level combination of the command/address signal.

3. The system of claim 1, wherein the active operation and the refresh operation are operations in which a word line coupled to the memory cell is selected and a voltage difference between a pair of bit lines coupled to the memory cell is sensed and amplified.

4. The system of claim 1, wherein the second semiconductor device includes:
    an input buffer suitable for generating the active signal, the pre-charge signal, and the addresses in accordance with a logic level combination of the command/address signal;
    a refresh signal generating unit suitable for generating the refresh signal in accordance with the logic level combination of the command/address signal;
    a refresh control unit suitable for generating the counting signals in response to the refresh signal; and
    a memory portion suitable for performing, in response to the active signal and the pre-charge signal, the active operation on the memory cell selected in accordance with a logic level combination of the addresses, and performing the refresh operation on the memory cell selected in accordance with a logic level combination of the counting signals.

5. The system of claim 1, wherein the memory portion includes:
    a switching signal generating unit suitable for generating first and second switching signals and the first and second column select signals which are selectively enabled by decoding the addresses and the counting signals;
    an enable signal generating unit suitable for generating the first and second enable signals which are selectively disabled in accordance with a combination of the counting signals if the refresh signal is enabled;
    a mat suitable for including a plurality of memory cells;
    a first sense amplifier suitable for controlling coupling of a pair of first bit lines which are coupled to the memory cell in response to the first column select signal and the first enable signal, and a pair of first segment lines; and
    a second sense amplifier suitable for controlling coupling of a pair of second bit lines which are coupled to the memory cell in response to the second column select signal and the second enable signal, and a pair of second segment lines.

6. The system of claim 5, wherein the first sense amplifier includes:
- a first amplification unit suitable for sensing and amplifying a voltage difference between a bit line and an inversion bit line coupled to the memory cell;
- a first coupling unit suitable for coupling the bit line to a segment line in response to the first column select signal and the first enable signal; and
- a second coupling unit suitable for coupling the inversion bit line to an inversion segment line in response to the first column select signal and the first enable signal.

7. The system of claim 6, wherein:
the first coupling unit decouples the bit line from the segment line if the first enable signal is disabled during the refresh operation; and
the second coupling unit decouples the inversion bit line from the inversion segment line if the first enable signal is disabled during the refresh operation.

8. The system of claim 5, wherein the second sense amplifier includes:
- a second amplification unit suitable for sensing and amplifying a voltage difference between a bit line and an inversion bit line coupled to the memory cell;
- a third coupling unit suitable for coupling the bit line to a segment line in response to the second column select signal and the second enable signal; and
- a fourth coupling unit suitable for coupling the inversion bit line to an inversion segment line in response to the second column select signal and the second enable signal.

9. The system of claim 8, wherein:
the third coupling unit decouples the bit line from the segment line if the second enable signal is disabled during the refresh operation; and
the fourth coupling unit decouples the inversion bit line from the inversion segment line if the second enable signal is disabled during the refresh operation.

10. The system of claim 5, wherein the memory portion further includes:
- a first switching unit suitable for coupling the pair of the first segment lines to a pair of a first I/O lines in response to the first switching signal; and
- a second switching unit suitable for coupling the pair of the second segment lines to a pair of a second I/O lines in response to the second switching signal.

* * * * *